(12) United States Patent
Yoshikawa

(10) Patent No.: US 8,542,018 B2
(45) Date of Patent: Sep. 24, 2013

(54) POWER TRANSMITTING APPARATUS

(75) Inventor: Hiroyasu Yoshikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 401 days.

(21) Appl. No.: 12/723,865

(22) Filed: Mar. 15, 2010

(65) Prior Publication Data
US 2010/0244839 A1    Sep. 30, 2010

(30) Foreign Application Priority Data
Mar. 31, 2009    (JP) ................. 2009-087596

(51) Int. Cl.
*G01V 3/00* (2006.01)
*H01F 27/42* (2006.01)

(52) U.S. Cl.
USPC ............ 324/322; 324/309; 324/318; 307/104

(58) Field of Classification Search
USPC .......... 324/300–322; 307/104; 600/407–465
See application file for complete search history.

(56) References Cited

U.S. PATENT DOCUMENTS

| | | | |
|---|---|---|---|
| 6,163,242 A | | 12/2000 | Crewson et al. |
| 8,378,525 B2 * | | 2/2013 | Yoshikawa ............... 307/104 |
| 2007/0222542 A1 | | 9/2007 | Joannopoulos et al. |
| 2008/0231120 A1 * | | 9/2008 | Jin ............... 307/104 |
| 2008/0266748 A1 | | 10/2008 | Lee |
| 2008/0278264 A1 | | 11/2008 | Karalis et al. |
| 2012/0001485 A1 * | | 1/2012 | Uchida ............... 307/11 |

FOREIGN PATENT DOCUMENTS

| | | |
|---|---|---|
| JP | 9-298847 | 11/1997 |
| JP | 10-107710 | * 4/1998 |
| JP | 2002-544756 | 12/2002 |
| JP | 2006-230129 | 8/2006 |
| JP | 2008-508842 | 3/2008 |
| JP | 2008-160312 | 7/2008 |
| JP | 2008-301918 | 12/2008 |
| JP | 2008-312357 | 12/2008 |
| JP | 2009-501510 | 1/2009 |
| WO | WO 00/69231 | 11/2000 |
| WO | WO 2006/011769 | 2/2006 |
| WO | WO 2007/008646 | 1/2007 |
| WO | WO 2008/118178 A1 | 10/2008 |

OTHER PUBLICATIONS

Japanese Office Action issued in Japanese App. No. 2009-087596, dated May 28, 2013 (with translation).

* cited by examiner

Primary Examiner — Jermele M Hollington
Assistant Examiner — Emily Chan
(74) Attorney, Agent, or Firm — Greer, Burns & Crain, Ltd.

(57) ABSTRACT

A power transmitting apparatus includes: a first magnetic resonance coil that externally transmits power as energy through magnetic resonance; a first power transmitting-and-receiving unit that supplies power to at least the first magnetic resonance coil; a second magnetic resonance coil that accepts the magnetic field energy through magnetic resonance occurring between the first magnetic resonance coil and the second magnetic resonance coil; a second power transmitting-and-receiving unit that accepts the power at least with reference to the second magnetic resonance coil; a main power supply; and a power supply-management unit configured to select either the power accepted by the second power transmitting-and-receiving unit or power transmitted from the main power supply, and transmit the selected power to the first power transmitting-and-receiving unit and/or transmit the power accepted by the second power transmitting-and-receiving unit and the power transmitted from the main power supply to the first power transmitting-and-receiving unit in combination.

11 Claims, 7 Drawing Sheets

POWER TRANSMITTING APPARATUS

CROSS-REFERENCE TO RELATED APPLICATIONS

This application is based upon and claims the benefit of priority of the prior Japanese Patent Application No. 2009-87596, filed on Mar. 31, 2009, the entire contents of which are incorporated herein by reference.

FIELD

The present invention relates to a power transmitting apparatus transmitting power through magnetic resonance.

BACKGROUND

Hitherto, technologies for supplying power wirelessly through electromagnetic induction and/or radio waves have been available. Further, in recent years, technologies for supplying power wirelessly through magnetic resonance achieved to make a magnetic field resonate have been developed. The magnetic resonance is a phenomenon in which magnetic fields are coupled to each other between two resonating coils and energy transmission occurs.

SUMMARY

According to an aspect of the invention, a power transmitting apparatus includes: a first magnetic resonance coil that externally transmits power as magnetic field energy through magnetic resonance; a first power transmitting-and-receiving unit that supplies power to at least the first magnetic resonance coil; a second magnetic resonance coil that accepts the magnetic field energy through magnetic resonance occurring between the first magnetic resonance coil and the second magnetic resonance coil; a second power transmitting-and-receiving unit that accepts the power at least with reference to the second magnetic resonance coil; a main power supply; and a power supply-management unit configured to select either the power accepted by the second power transmitting-and-receiving unit or power transmitted from the main power supply, and transmit the selected power to the first power transmitting-and-receiving unit and/or transmit the power accepted by the second power transmitting-and-receiving unit and the power transmitted from the main power supply to the first power transmitting-and-receiving unit in combination.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

For transmitting power wirelessly through magnetic resonance, the power transmission efficiency is increased with an increase in the degree of coupling between magnetic fields occurring between two coils. Therefore, it is preferable that the degree of coupling between magnetic fields occurring between coils be increased.

However, if an area specified on a power receiving coil to perceive variations in a magnetic flux is smaller than that specified on a power transmitting coil, it becomes difficult to increase the degree of coupling between magnetic fields and the transmission efficiency is decreased. For example, when the cabinet of a device including the power receiving coil is small in size, it is difficult to specify a sufficiently large loop area on the power receiving coil. Likewise, if it is difficult to provide the loop face of the power receiving coil so that the loop face is opposed to that of the power transmitting coil, the transmission efficiency is decreased.

In the past, when the transmission efficiency decreased due to a factor occurring on the power receiving-side, part of the energy transmitted from the power transmitting coil was entirely lost, because that part of the energy was not accepted by a device provided on the power receiving-side.

Accordingly, technologies disclosed in this application have been achieved to provide a power transmitting apparatus configured to increase the transmission efficiency by reducing losses of energy for transmission during the wireless power transmission achieved through magnetic resonance.

<Means for Solving the Problems>

A power transmitting apparatus disclosed in this application includes a first magnetic resonance coil configured to externally transmit power as magnetic field energy through magnetic resonance, and a second magnetic resonance coil configured to accept the magnetic field energy through the magnetic resonance occurring between the first magnetic resonance coil and the second magnetic resonance coil. The magnetic field energy accepted by the second magnetic resonance coil flows back to the first magnetic resonance coil.

<Advantages>

A power transmitting apparatus disclosed in this application may increase the transmission efficiency by reducing losses of energy for transmission during the wireless power transmission achieved through magnetic resonance.

<Description of the Embodiments>

Hereinafter, a power transmitting apparatus according to an embodiment of the present invention, that is, a power transmitting apparatus disclosed in this application will be described in detail with reference to the attached drawings. The above-described embodiment does not limit the disclosed technologies.

First Embodiment

Figure 1:
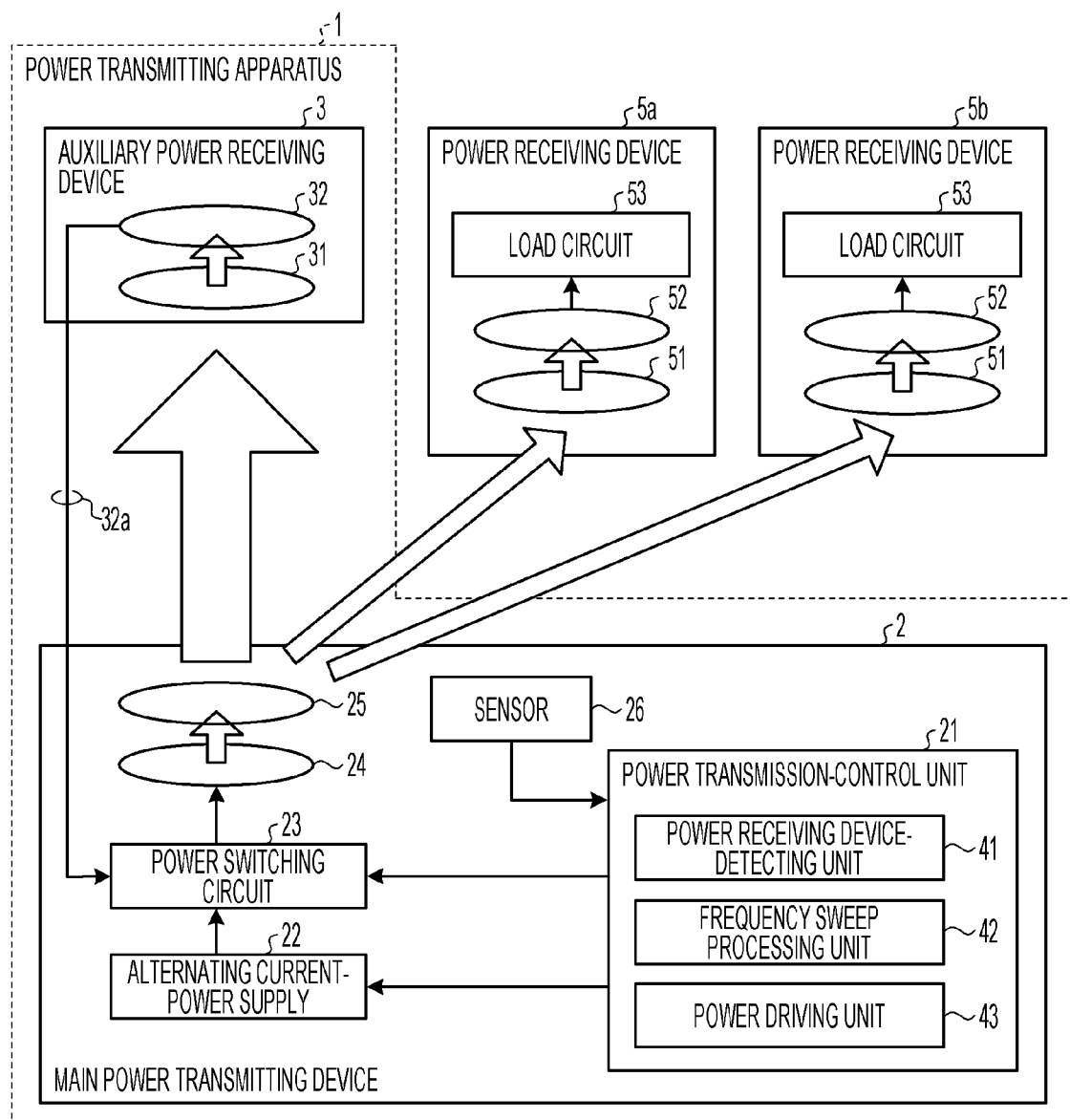
FIG. 1 illustrates an exemplary schematic configuration of a power transmitting apparatus according to a first embodiment of the present invention.

FIG. 1 illustrates an exemplary schematic configuration of a power transmitting apparatus according to a first embodiment of the present invention. A power transmitting apparatus 1 illustrated in FIG. 1 wirelessly supplies power to each of power receiving devices 5a and 5b. The power transmitting apparatus 1 includes a main power transmitting device 2 and an auxiliary power receiving device 3.

The main power transmitting device 2 includes a power transmission-control unit 21, an alternating current-power supply 22, a power switching circuit 23, a power supply coil 24, a power transmitting coil 25, and a sensor 26. Further, the auxiliary power receiving device 3 includes a power receiving coil 31 and a power extracting coil 32. Each of the power receiving devices 5a and 5b includes a power receiving coil 51, a power extracting coil 52, and a load circuit 53.

Each of the power transmitting coil 25, and the power receiving coils 31 and 51 is an LC resonant circuit and functions as a magnetic resonance coil. The capacitor component of the LC resonant circuit may be achieved through an element and/or stray capacitance achieved by releasing both the ends of the coil. When an inductance is expressed by the sign L and the capacitor capacity is expressed by the sign C, a resonance frequency expressed by the sign f is determined as illustrated by the following expression:

[Numerical Expression 1]

$$f = \frac{1}{2\pi\sqrt{LC}} \quad (1)$$

When the resonance frequency of the power transmitting coil 25 and that of the power receiving coil 31 are sufficiently close to each other, and the distance between the power transmitting coil 25 and the power receiving coil 31 is appropriately small, magnetic resonance may occur between the power transmitting coil 25 and the power receiving coil 31.

Likewise, when the resonance frequency of the power transmitting coil 25 and that of the power receiving coil 51 are sufficiently close to each other and the distance between the power transmitting coil 25 and the power receiving coil 51 is appropriately small, magnetic resonance may occur between the power transmitting coil 25 and the power receiving coil 51.

Therefore, when the magnetic resonance occurs while the power transmitting coil 25 resonates, magnetic field energy may be transmitted from the power transmitting coil 25 to each of the power receiving coils 31 and 51.

The power supply coil 24 is a power transmitting-and-receiving unit configured to supply power to the power transmitting coil 25 through electromagnetic induction. The power supply coil 24 and the power transmitting coil 25 are arranged at a distance from each other, where the distance is long enough to cause electromagnetic induction. The power transmitting coil 25 is caused to resonate through the electromagnetic induction via the power supply coil 24. Accordingly, the power transmitting coil 25 need not be electrically connected to a different circuit and the resonance frequency of the power transmitting coil 25 may be designed arbitrarily with high precision.

In each of the power receiving devices 5a and 5b, the power extracting coil 52 is arranged at a position specified so that electromagnetic induction occurs between the power receiving coil 51 and the power extracting coil 52. When the power receiving coil 51 resonates through magnetic resonance, energy is moved from the power receiving coil 51 to the power extracting coil 52 due to electromagnetic induction. The power extracting coil 52 is electrically connected to the load circuit 53, and the energy moved to the power extracting coil 52 due to the electromagnetic induction is supplied to the load circuit 53 as power. That is to say, the power extracting coil 52 functions as a power transmitting-and-receiving unit. The load circuit 53 may be an arbitrary circuit such as a battery.

Thus, power is extracted from the power receiving coil 51 through electromagnetic induction via the power extracting coil 52. Accordingly, the power receiving coil 51 may not be electrically connected to a different circuit and the resonance frequency of the power receiving coil 51 may be arbitrarily designed with high precision.

The power extracting coil 32 of the auxiliary power receiving device 3 is arranged at a position specified so that electromagnetic induction occurs between the power receiving coil 31 and the power extracting coil 32. When the power receiving coil 31 resonates through magnetic resonance, energy is moved from the power receiving coil 31 to the power extracting coil 32 due to the electromagnetic induction. The power extracting coil 32 is electrically connected to the power switching circuit 23 via a power feedback path 32a. The energy moved to the power extracting coil 32 due to the electromagnetic induction is supplied to the power switching circuit 23 as power. That is to say, the power extracting coil 32 functions as a power transmitting-and-receiving unit.

Thus, power is extracted from the power receiving coil 31 through electromagnetic induction via the power extracting coil 32. Accordingly, the power receiving coil 31 may not be electrically connected to a different circuit and the resonance frequency of the power receiving coil 31 may be arbitrarily designed with high precision.

The alternating current-power supply 22 is a main power supply configured to externally transmit an alternating current with a frequency and an amplitude that are specified through the power transmission-control unit 21. Hereinafter, the above-described frequency of the alternating current-power supply 22 will be referred to as a driving frequency. The power supply coil 23 electrically connected to the alternating current-power supply 22 vibrates at the driving frequency.

The power switching circuit 23 is a power management unit configured to select either the power transmitted from the auxiliary power receiving device 32 or that transmitted from the alternating current-power supply 22 and transmit the selected power to the power supply coil 24, and/or transmit the power transmitted from the auxiliary power receiving device 32 and that transmitted from the alternating current-power supply 22 in combination to the power supply coil 24.

The power supply coil 24 is excited by the driving frequency through the power switching circuit 23. Therefore, the power transmitting coil 25 resonates at the driving frequency. Likewise, the power receiving coil 31 resonates at the driving frequency.

Thus, in the power transmitting apparatus 1, the power of the alternating current-power supply 22 is transmitted to the load circuit 53 via the electromagnetic induction attained between the power supply coil 24 and the power transmitting coil 25, the magnetic resonance attained between the power transmitting coil 25 and the power receiving coil 51, and the electromagnetic induction attained between the power receiving coil 51 and the power extracting coil 52.

Further, due to the magnetic resonance occurring between the power receiving coil 31 of the auxiliary power receiving device 3 and the power transmitting coil 25, the auxiliary power receiving device 3 accepts part of the energy transmitted from the power transmitting coil 25, and returns part of the energy back to the main power transmitting device 2 through electromagnetic induction occurring between the power receiving coil 31 and the power extracting coil 32.

The efficiency of the power transmission attained through the magnetic resonance occurring between the power transmitting coil 25 and each of the power receiving coils 31 and 51 depends on a performance indicator expressed by the following expression:

[Numerical Expression 2]

$$\frac{\kappa}{\sqrt{\Gamma_1 \Gamma_2}} \quad (2)$$

Here, the sign κ denotes the magnitude of the energy flow attained per unit time, that is, the coupling efficiency indicating the degree of coupling between magnetic fields occurring between the two coils. Further, the sign $\Gamma_1$ indicates the energy loss occurring per unit time of the power transmitting coil 25, and the sign $\Gamma_2$ indicates the energy loss occurring per unit time of the power receiving coil 31.

As indicated by the above-described numerical expression, the efficiency of power transmission attained through the magnetic resonance may be increased with an increase in the coupling efficiency K.

However, if an area specified on the power receiving coil 51 of each of the power receiving devices 5a and 5b to perceive variations in a magnetic flux is smaller than that specified on the power transmitting coil 25, it becomes difficult to increase the degree of coupling between the magnetic fields and the transmission efficiency is decreased. For example, when the housing of each of the power receiving devices 5a and 5b is small in size, it is difficult to specify a sufficiently large loop area on the power receiving coil 51. Likewise, if it is difficult to arrange the loop face of the power receiving coil 51 of each of the power receiving devices 5a and 5b so that the loop face is opposed to that of the power transmitting coil 25, the transmission efficiency is decreased.

For avoiding the entire loss of part of the energy transmitted from the power transmitting coil 25, where the part is not accepted by the power receiving devices 5a and 5b, the power transmitting apparatus 1 collects the energy transmitted from the power transmitting coil 25 through the auxiliary power receiving device 3. Consequently, it becomes possible to reduce losses of the energy for transmission during the wireless power transmission attained through the magnetic resonance so that the transmission efficiency is increased.

Figure 2:
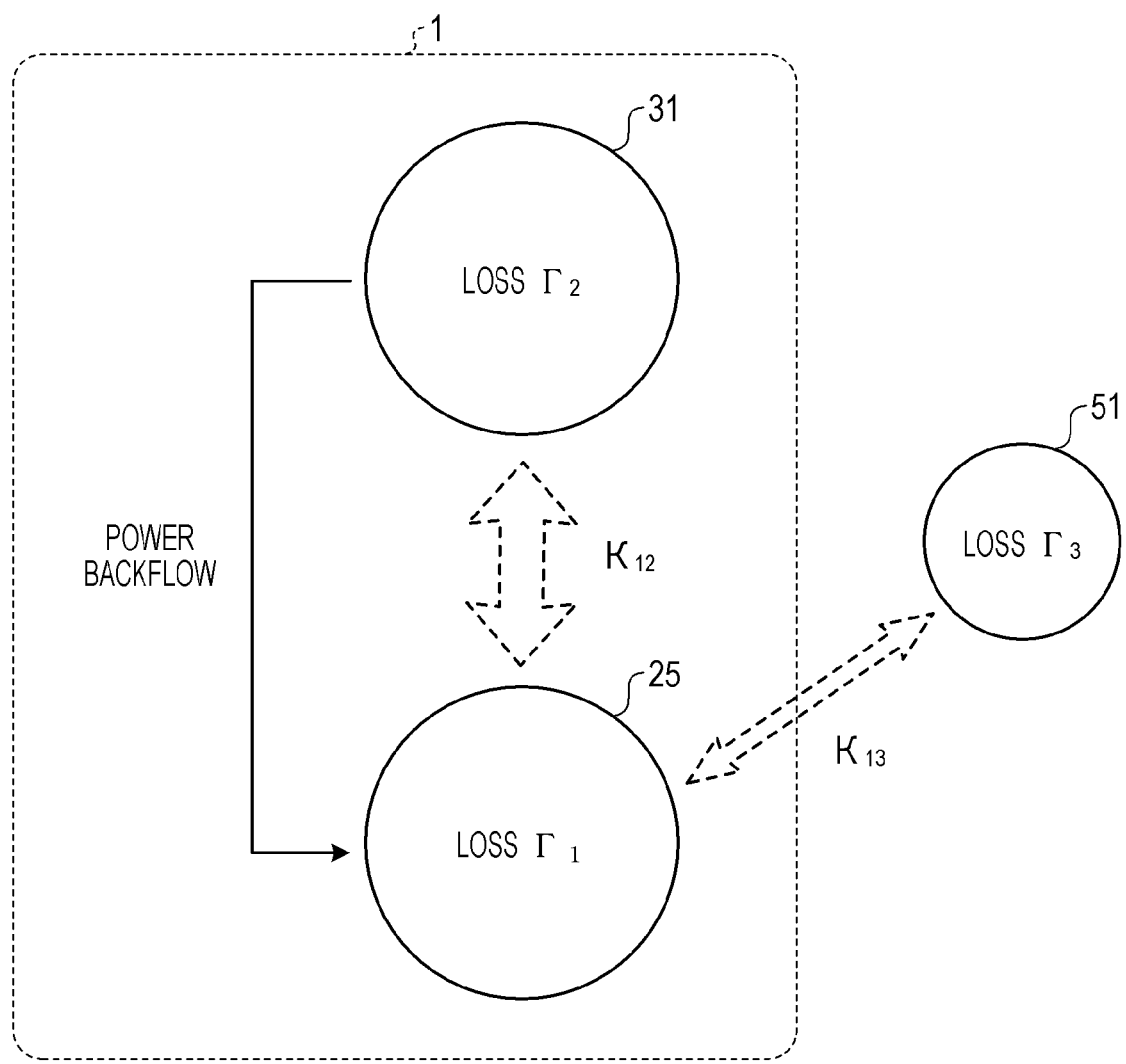
FIG. 2 illustrates power transmission and backflow that are attained through magnetic resonance.

FIG. 2 illustrates power transmission and backflow that are attained through the magnetic resonance. In FIG. 2, the energy loss of the power transmitting coil 25 is expressed by the sign $\Gamma_1$, the energy loss of the power receiving coil 31 of the auxiliary power receiving device 3 is expressed by the sign $\Gamma_2$, and the energy loss of the power receiving coil 51 of each of the power receiving devices 5a and 5b is expressed by the sign $\Gamma_3$. Further, the coupling between the magnetic field of the power transmitting coil 25 and that of the power receiving coil 31 of the auxiliary power receiving device 3 is expressed by the sign $\kappa_{12}$, and the coupling between the magnetic field of the power transmitting coil 25 and that of the power receiving coil 51 of each of the power receiving devices 5a and 5b is expressed by the sign $\kappa_{13}$.

The shape and the arrangement of the power receiving coil 31 of the auxiliary power receiving device 3 may be designed in advance based on the power transmitting coil 25. Therefore, it becomes possible to decrease the energy loss $\Gamma_2$ and increase the magnetic field coupling $\kappa_{12}$ to obtain high transmission efficiency.

Therefore, even though the energy loss $\Gamma_3$ of the power receiving coil 51 of the power receiving device is large and the magnetic field coupling $\kappa_{13}$ is small, the magnetic field energy transmitted from the power transmitting coil 25 may be collected through the power receiving coil 31 with efficiency and partially flowed back to the power transmitting coil 25.

Returning to FIG. 1, the sensor 26 measures the magnitude of a magnetic field near the power transmitting coil 25 and transmits the current corresponding to the magnetic field magnitude. The power transmission-control unit 21 includes a power receiving device-detecting unit 41, a frequency sweep processing unit 42, and a power driving unit 43.

The power receiving device-detecting unit 41 is a processing unit configured to detect that each of the power receiving devices 5a and 5b approaches and enters an area where the power receiving device may receive power wirelessly transmitted from the power transmitting apparatus 1. When the alternating current-power supply 22 is driven at a constant frequency and a constant amplitude, and the power transmitting coil 25 resonates, the magnetic field energy transmitted from the power transmitting coil 25 through the magnetic resonance is increased with a decrease in the distance between the power transmitting coil 25 and the power receiving coil 51. Therefore, when the alternating current-power supply 22 is driven at a constant frequency and a constant amplitude and the magnitude of the magnetic field near the power transmitting coil 25 is measured through the sensor 26, the approach of the power receiving coil 51, that is, the approach of each of the power receiving devices 5a and 5b may be detected. More specifically, the power receiving device-detecting unit 41 transmits data indicating the detection of the power receiving device when the value of a current transmitted from the sensor 26 exceeds a threshold value Th.

The frequency sweep processing unit 42 is a processing unit configured to change the driving frequency and acquire data of a change in the value of the current transmitted from the sensor 26. The change in the driving frequency sweeps a given area. The current transmitted from the sensor 26 indicates the magnitude of the magnetic field near the power transmitting coil 25 and the magnetic field magnitude is increased as the power receiving coil 51 approaches the power transmitting coil 25. Namely, the magnetic field magnitude is increased with an increase in the power feeding efficiency. Therefore, the result of processing performed through the frequency sweep processing unit 42 indicates the distribution of power feeding efficiencies with reference to the driving frequency.

The power driving unit 43 selects a driving frequency obtained when the power feeding efficiency is maximized based on the frequency sweep result and drives the alternating current-power supply 22 so that energy is transmitted between the power transmitting coil 25 and the power receiving coil 51.

Figure 3:
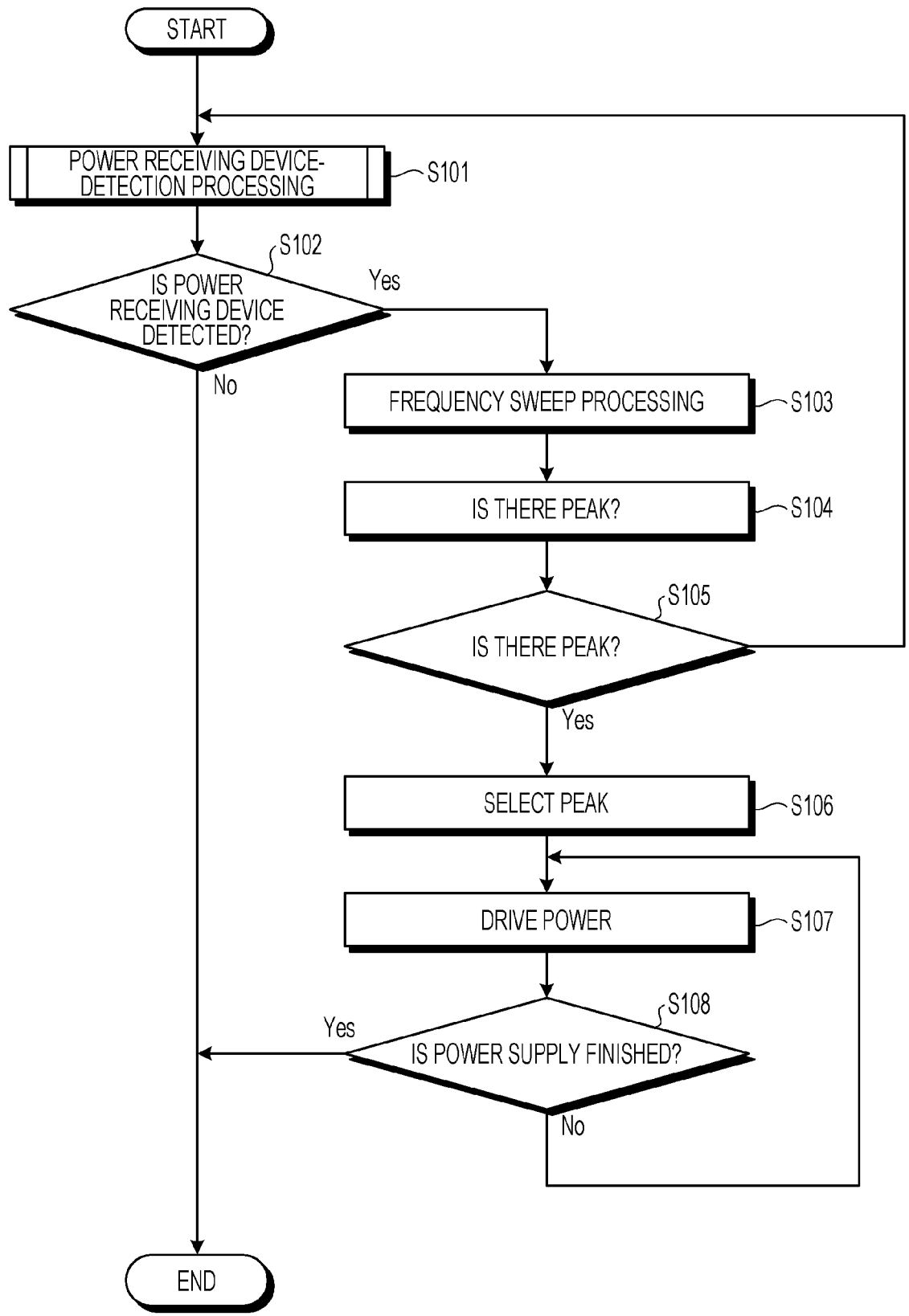
FIG. 3 is a flowchart illustration processing operations performed through a power transmission-control unit.

FIG. 3 is a flowchart illustrating processing operations performed through the power transmission-control unit 21. The power transmission-control unit 21 executes processing operations that are illustrated in FIG. 3 at regular intervals. When the processing operations are started, the power receiving device-detecting unit 41 executes power receiving device-detection processing in the first place (operation S101).

If data indicating the detection of the power receiving device is not transmitted as a result of the power receiving device-detection processing (when the answer is No at operation S102), the power transmission-control unit 21 finishes the processing as it is. If the data indicating the power receiving device-detection is transmitted as a result of the power receiving device-detection processing (when the answer is Yes at operation S102), the frequency sweep processing unit 42 executes the frequency sweep processing (operation S103). The frequency sweep processing unit 42 executes peak detection processing to detect the peak of the power feeding efficiency from the distribution of the power feeding efficiencies with reference to the driving frequency, the distribution being obtained as a result of the frequency sweep processing (operation S104).

When the power feeding efficiency-peak is not detected as a result of the peak detection processing (when the answer is No at operation S105), the processing returns to the power receiving device-detection processing performed through the power receiving device-detecting unit 41 (operation S101). On the other hand, when the peak is detected (when the answer is Yes at operation S105), the power driving unit 43 selects the driving frequency of the peak (operation S106), drives the alternating current-power supply 22 (operation S107), and causes magnetic resonance between the power transmitting coil 25 and the power receiving coil 51 and supplies power to the power receiving device 3.

After that, when power requirements are satisfied (when the answer is Yes at operation S108), the power transmission-control unit 21 stops supplying power and finishes the processing. The requirements for finishing the power supply may be arbitrarily determined, that is to say, the power supply may be stopped upon receiving an instruction to stop supplying power and/or when the value of the power feeding efficiency becomes equivalent to a given value or less, for example. When the requirements for finishing the power supply are not satisfied (when the answer is No at operation S108), the power supply driving (operation S107) is continued so that the power supply is continued.

Figure 4:
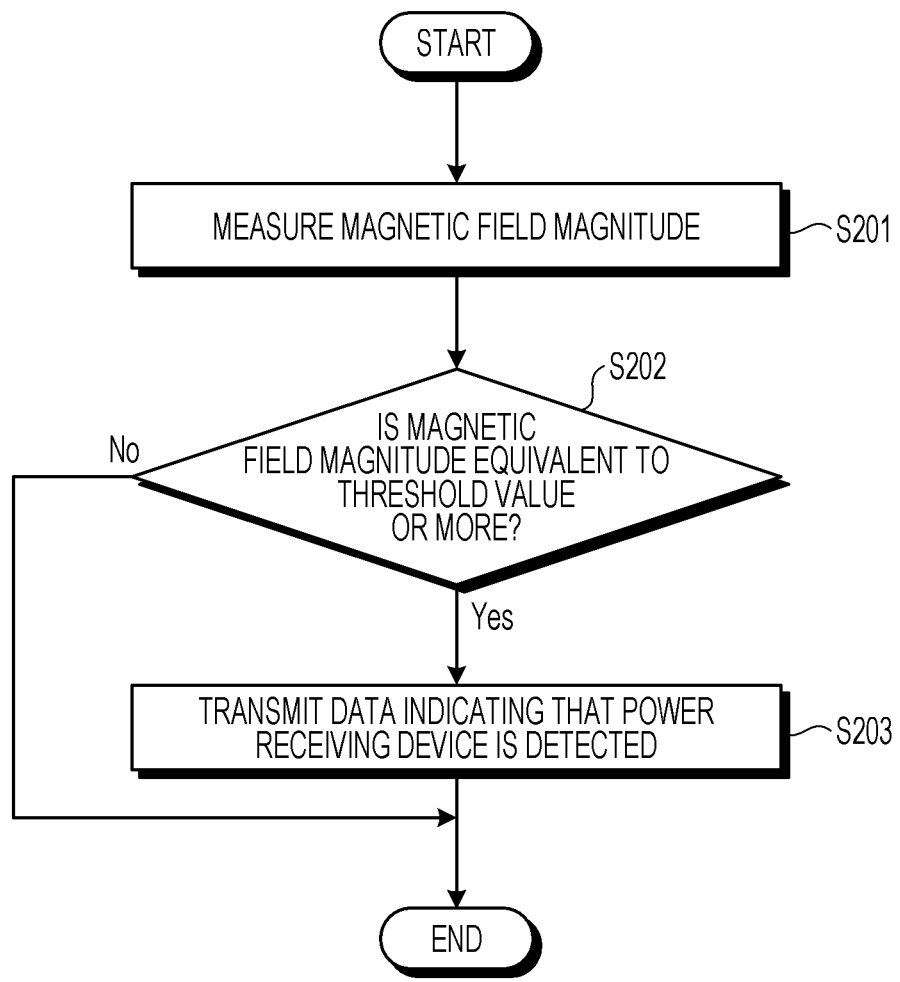
FIG. 4 is a flowchart illustrating the details of power receiving device-detection processing.

FIG. 4 is a flowchart illustrating the details of the power receiving device-detection processing. When the power receiving device-detection processing is started, the sensor 26 measures the magnetic field magnitude (operation S201), and the power receiving device-detecting unit 41 determines whether or not the value of the magnetic field magnitude is equivalent to the threshold value or more (operation S202). Since the magnetic field magnitude is obtained as the value of the current transmitted from the sensor 26, the power receiving device-detecting unit 41 determines the magnetic field magnitude by comparing the current value to the threshold value.

If the result of the determination made by the power receiving device-detecting unit 41 illustrates that the value of the magnetic field magnitude is less than the threshold value (when the answer is No at operation S202), the power receiving device-detecting unit 41 finishes the power receiving device-detection processing as it is. On the other hand, when the value of the magnetic field magnitude is equivalent to the threshold value or more (when the answer is Yes at operation S202), the power receiving device-detecting unit 41 transmits data indicating that the power receiving device is detected (operation S203), and finishes the processing.

Here, it should be noted that the power receiving device-detection processing illustrated in FIG. 4 has been exemplarily described. Namely, the detection of approach of each of the power receiving devices 5a and 5b may be achieved through arbitrary technologies. For example, each of the power receiving devices 5a and 5b may be detected through an optical sensor provided separately. Further, in the case where the magnetic resonance is detected, the output of the alternating current-power supply may be reduced so as to be lower than that obtained at the power supply time during the power receiving device-detection processing, for example.

Next, the separation of the peak of a driving current will be described. The driving frequency corresponding to energy at its peak, the energy being transmitted through magnetic resonance occurring between the power transmitting coil 25 and the power receiving coil 31, that is, the driving frequency corresponding to the maximum power feeding efficiency is obtained near the resonance frequency of the coil. However, when the distance between the power transmitting coil 25 and the power receiving coil 31 is reduced to a degree, the separation of the driving frequency corresponding to the maximum power feeding efficiency is confirmed.

Figure 5:
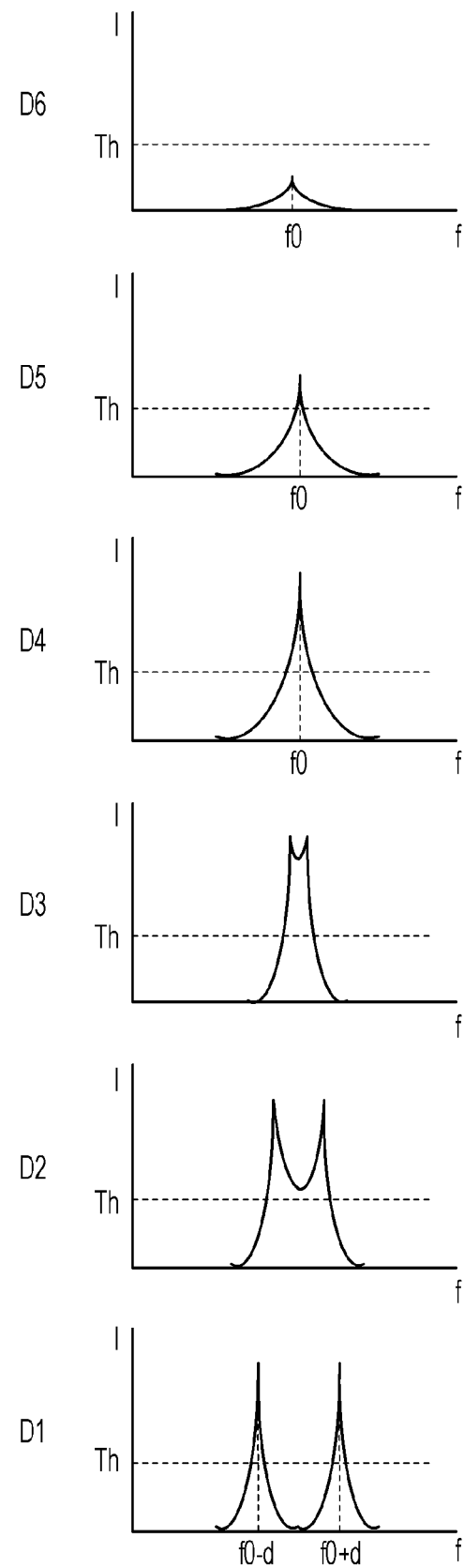
FIG. 5 illustrates the separation of driving frequencies corresponding to the maximum power feeding efficiency.

FIG. 5 illustrates the separation of each of several driving frequencies corresponding to the maximum power feeding efficiency. In FIG. 5, the sign f denotes a driving frequency. Further, the sign I denotes a current transmitted from the sensor 26, which corresponds to the power feeding efficiency. The threshold value Th is determined to detect the approach of the power receiving coil 51. Each of the signs D1, D2, D3, D4, D5, and D6 denotes the distance between the power transmitting coil 25 and the power receiving coil 31, where the relationship D1<D2<D3<D4<D5<D6 holds.

As illustrated in FIG. 5, when each of the distances D6 to D4 is attained, the current value I reaches its peak at a driving frequency f0. The peak value is increased with a decrease in the distance. On the other hand, when each of the distances D1 to D3 is attained, the peak is separated into two peaks including a peak attained on the low frequency-side of the driving current f0 and a peak attained on the high frequency-side of the driving current f0. Of the separated peaks, the peak attained on the high frequency-side denotes a driving frequency f0+d and that attained on the low frequency-side denotes a driving frequency f0−d.

Figure 6:
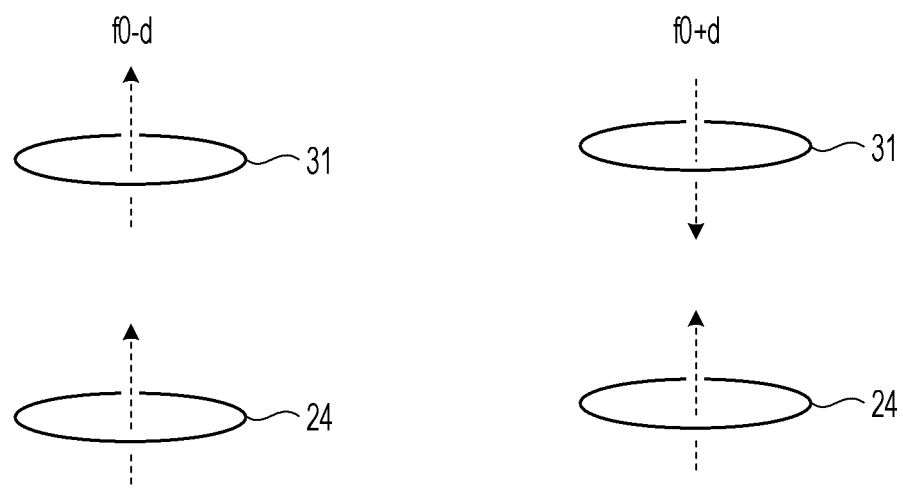
FIG. 6 illustrates magnetic resonance achieved when a driving frequency obtained when a current value I reaches its peak is separated into a driving frequency $f0+d$ and a driving frequency $f0-d$.

FIG. 6 illustrates magnetic resonance occurring when a driving frequency attained when the current value I reaches its peak is separated into the driving frequency f0+d and the driving frequency f0−d. When magnetic resonance occurs at the driving frequency f0−d on the low frequency-side, the resonance of the power transmitting coil 25 and that of the power receiving coil 31 are in phase with each other so that the directions of the magnetic fields agree with each other. Therefore, while the power supply is performed through the magnetic resonance, strong magnetic fields occur between the power transmitting coil 25 and the power receiving coil 31.

On the other hand, when magnetic resonance occurs at the driving frequency f0+d on the high frequency-side, the resonance of the power transmitting coil 25 and that of the power receiving coil 31 are opposite in phase to each other so that the directions of the magnetic fields are reversed. Therefore, the magnetic fields occurring between the power transmitting coil 25 and the power receiving coil 31 while the power supply is performed through the magnetic resonance are weaker than in the case where the magnetic resonance occurs at the driving frequency f0−d, and cancel each other in some locations.

When the magnetic resonance occurs between the main power transmitting device 2 and the auxiliary power receiving device 3 at the driving frequency f0+d attained on the high frequency side, a place where the magnetic fields of the main power transmitting device 2 and the auxiliary power receiving device 3 cancel each other occurs. For attaining energy transmission with efficiency by achieving magnetic resonance between each of the power receiving devices 5a and 5b that are provided as the power transmission destinations and the main power transmitting device 2, it is preferable that a stable magnetic field be produced between the main power transmitting device 2 and the auxiliary power receiving device 3.

Therefore, if the separation occurs in the peak of the driving frequency, the power transmission-control unit 21 achieves the magnetic resonance through the use of the driving frequency f0−d attained on the low-frequency side.

As described above, the power transmitting apparatus 1 of the first embodiment includes the power transmitting coil 25 configured to transmit power to each of the power receiving devices 5a and 5b through the magnetic resonance and the auxiliary power receiving device 3 configured to flow energy accepted through the magnetic resonance achieved between the power transmitting coil 25 and the power receiving coil 31 back to the power transmitting coil 25 as power. Therefore, it becomes possible to collect part of the energy that is not accepted by each of the power receiving devices 5a and 5b of the energy transmitted from the power transmitting coil 25 to decrease the energy losses and increase the transmission efficiency.

Second Embodiment

Figure 7:
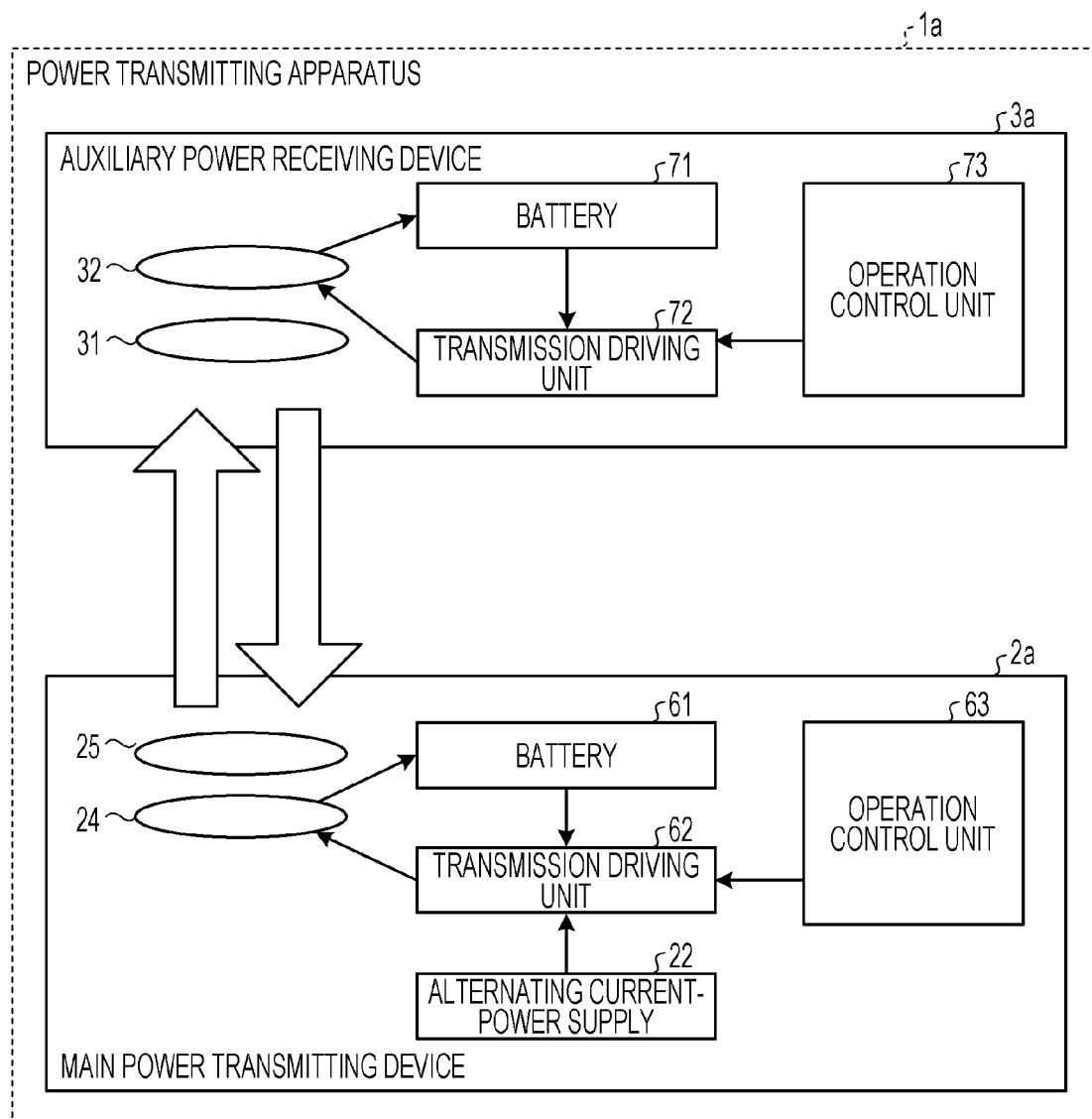
FIG. 7 illustrates an exemplary schematic configuration of a power transmitting apparatus according to a second embodiment of the present invention.

FIG. 7 illustrates an exemplary schematic configuration of a power transmitting apparatus 1a according to a second embodiment of the present invention. The power transmitting apparatus 1a illustrated in FIG. 7 wirelessly supplies power to a power receiving device (not illustrated). The power transmitting apparatus 1a includes a main power transmitting device 2a and an auxiliary power receiving device 3a.

The power transmitting apparatus 1a switches between a main power transmission operation performed to transmit energy from the main power transmitting device 2a to the auxiliary power receiving device 3a through magnetic resonance and a backflow operation performed to transmit energy from the auxiliary power receiving device 3a to the main power transmitting device 2a through magnetic resonance.

The auxiliary power receiving device 3a includes a power receiving coil 31, a power extracting coil 32, a battery 71, a transmission driving unit 72, and an operation control unit 73. During the main power transmission operation, the power receiving coil 31 accepts magnetic field energy transmitted from the main power transmitting device 2a through magnetic resonance, and the power extracting coil 32 extracts power from the power receiving coil 31 through electromagnetic induction and accumulates the power in the battery 71.

Then, during the backflow operation, the transmission driving unit 72 supplies power to the power extracting coil 32 as a power supply. The power extracting coil 32 passes the supplied power to the power receiving coil 31 through electromagnetic induction. The power receiving coil 31 transmits magnetic field energy to the power transmitting coil 25 through magnetic resonance occurring between the power receiving coil 31 and the power transmitting coil 25 of the main power transmitting device 2a. The operation control unit 73 functions as an operation switching unit configured to switch between the main power transmitting operation and the backflow operation in the auxiliary power receiving device 3a.

The main power transmitting device 2a includes the alternating current-power supply 22, the power supply coil 24, the power transmitting coil 25, a battery 61, a transmission driving unit 62, and an operation control unit 63. During the main power transmitting operation, the transmission driving unit 62 selects either power transmitted from the alternating current-power supply 22 or power transmitted from the battery 61 and transmits the selected power to the power supply coil 24 and/or transmits the power transmitted from the alternating current-power supply 22 and that transmitted from the battery 61 in combination to the power supply coil 24 that supplies power to the power transmitting coil 25 through electromagnetic induction. Then, the power transmitting coil 25 supplies power to the power receiving coil 31 through magnetic resonance.

Then, during the backflow operation, the power transmitting coil 25 accepts magnetic field energy transmitted from the auxiliary power receiving device 3a through magnetic resonance and the power supply coil 24 extracts power from the power transmitting coil 25 through electromagnetic induction and accumulates the power in the battery 61. The operation control unit 63 functions as an operation switching unit configured to switch between the main power transmitting operation and the backflow operation in the main power transmitting device 2a.

Thus, as is the case with the first embodiment, the power transmitting apparatus 1a of the second embodiment includes the power transmitting coil 25 configured to transmit power to each of the power receiving devices 5a and 5b through the magnetic resonance and the auxiliary power receiving device 3a configured to flow energy transmitted through the magnetic resonance achieved between the power transmitting coil 25 and the power receiving coil 31 back to the power transmitting coil 25 as power. Therefore, it becomes possible to decrease the energy losses and increase the transmission efficiency.

Further, in the power transmitting apparatus 1a, power flows from the auxiliary power receiving device 3a back to the main power transmitting device 2a through the magnetic resonance. Therefore, the power backflow may be achieved wirelessly.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A power transmitting apparatus comprising:
a first magnetic resonance coil configured to externally transmit power as magnetic field energy through magnetic resonance;
a first power transmitting-and-receiving unit configured to supply power to at least the first magnetic resonance coil;
a second magnetic resonance coil configured to accept the magnetic field energy through magnetic resonance occurring between the first magnetic resonance coil and the second magnetic resonance coil;
a second power transmitting-and-receiving unit configured to accept the power at least with reference to the second magnetic resonance coil;
a main power supply;
a power supply-management unit configured to select (a) either the power accepted by the second power transmitting-and-receiving unit or power transmitted from the main power supply, and transmit the selected power to the first power transmitting-and-receiving unit, and/or (b) transmit the power accepted by the second power transmitting-and-receiving unit and the power transmitted from the main power supply to the first power transmitting-and-receiving unit in combination; and a power backflow path provided to entirely electrically connect between the second power transmitting-and-receiving unit and the power supply-management unit;
wherein the first power transmitting-and-receiving unit receives the power accepted by the second power transmitting-and-receiving unit without the second magnetic resonance coil.

2. The power transmitting apparatus according to claim 1, further comprising an operation switching unit configured to supply power based on power transmitted via power backflow path and power from the main power supply.

3. The power transmitting apparatus according to claim 2, further comprising a driving unit, coupled to the main power supply, configured to achieve the magnetic resonance at a driving frequency attained on a low frequency-side when a plurality of peak driving frequencies are detected by a frequency sweep processing unit.

4. The power transmitting apparatus according to claim 1, further comprising an operation switching unit configured to switch between a main power transmitting operation performed to transmit magnetic energy from the first magnetic resonance coil to the second magnetic resonance coil and a backflow operation performed to transmit magnetic energy from the second magnetic resonance coil to the first magnetic resonance coil, wherein the second power transmitting-and-receiving unit supplies power accepted when the main power transmitting operation is performed to the second magnetic resonance coil when the backflow operation is performed, wherein the first power transmitting-and-receiving unit accepts power transmitted from the first magnetic resonance coil when the backflow operation is performed, and wherein the power supply-management unit selects either the power supplied from the main power supply or the power accepted when the backflow operation is performed for use when the main power transmitting operation is performed and/or uses the power supplied from the main power supply and the power accepted when the backflow operation is performed in combination when the main power transmitting operation is performed.

5. The power transmitting apparatus according to claim 4, wherein each of the first and second power transmitting-and-receiving units is an electromagnetic induction coil configured to supply and/or extract power through electromagnetic induction.

6. The power transmitting apparatus according to claim 4, further comprising a driving unit, coupled to the main power supply, configured to achieve the magnetic resonance at a driving frequency attained on a low frequency-side when a plurality of peak driving frequencies are detected by a frequency sweep processing unit.

7. The power transmitting apparatus according to claim 1, wherein each of the first and second power transmitting-and-receiving units is an electromagnetic induction coil configured to supply and/or extract power through electromagnetic induction.

8. The power transmitting apparatus according to claim 7, further comprising a driving unit, coupled to the main power supply, configured to achieve the magnetic resonance at a driving frequency attained on a low frequency-side when a plurality of peak driving frequencies are detected by a frequency sweep processing unit.

9. The power transmitting apparatus according to claim 2, wherein each of the first and second power transmitting-and-receiving units is an electromagnetic induction coil configured to supply and/or extract power through electromagnetic induction.

10. The power transmitting apparatus according to claim 1, further comprising a driving unit, coupled to the main power supply, configured to achieve the magnetic resonance at a driving frequency attained on a low frequency-side when a plurality of peak driving frequencies are detected by a frequency sweep processing unit.

11. A power transmitting apparatus comprising:
a first magnetic resonance coil configured to externally transmit power as magnetic field energy through magnetic resonance;
a first power transmitting-and-receiving unit configured to supply power to at least the first magnetic resonance coil;
a second magnetic resonance coil configured to accept the magnetic field energy through magnetic resonance occurring between the first magnetic resonance coil and the second magnetic resonance coil;
a second power transmitting-and-receiving unit configured to accept the power at least with reference to the second magnetic resonance coil;
a main power supply;
a power supply-management unit configured to select (a) either the power accepted by the second power transmitting-and-receiving unit or power transmitted from the main power supply, and transmit the selected power to the first power transmitting-and-receiving unit, and/or (b) transmit the power accepted by the second power transmitting-and-receiving unit and the power transmitted from the main power supply to the first power transmitting-and-receiving unit in combination; and
an operation switching unit configured to switch between a main power transmitting operation performed to transmit magnetic energy from the first magnetic resonance coil to the second magnetic resonance coil and a backflow operation performed to transmit magnetic energy from the second magnetic resonance coil to the first magnetic resonance coil,
wherein the second power transmitting-and-receiving unit supplies power accepted when the main power transmitting operation is performed to the second magnetic resonance coil when the backflow operation is performed, wherein the first power transmitting-and-receiving unit accepts power transmitted from the first magnetic resonance coil when the backflow operation is performed, and wherein the power supply-management unit selects either the power supplied from the main power supply or the power accepted when the backflow operation is performed for use when the main power transmitting operation is performed and/or uses the power supplied from the main power supply and the power accepted when the backflow operation is performed in combination when the main power transmitting operation is performed.

* * * * *